(12) United States Patent
Koli

(10) Patent No.: US 8,063,806 B2
(45) Date of Patent: Nov. 22, 2011

(54) APPARATUS COMPRISING FREQUENCY SELECTIVE CIRCUIT AND METHOD

(75) Inventor: Kimmo Koli, Helsinki (FI)

(73) Assignee: Nokia Corporation, Espoo (FI)

( * ) Notice: Subject to any disclaimer, the term of this patent is extended or adjusted under 35 U.S.C. 154(b) by 227 days.

(21) Appl. No.: 12/519,904

(22) PCT Filed: Dec. 19, 2007

(86) PCT No.: PCT/FI2007/050705
§ 371 (c)(1),
(2), (4) Date: Jun. 18, 2009

(87) PCT Pub. No.: WO2008/074922
PCT Pub. Date: Jun. 26, 2008

(65) Prior Publication Data
US 2010/0097258 A1    Apr. 22, 2010

(30) Foreign Application Priority Data
Dec. 21, 2006    (FI) ..................................... 20065832

(51) Int. Cl.
*H03M 3/00* (2006.01)

(52) U.S. Cl. .......................... 341/143; 341/155; 341/156
(58) Field of Classification Search .................. 455/340, 455/313, 307, 192.1, 295, 285; 341/143, 341/155, 156
See application file for complete search history.

(56) References Cited

U.S. PATENT DOCUMENTS

| 4,696,055 | A |   | 9/1987 | Marshall |
| 5,613,234 | A | * | 3/1997 | Vella-Coleiro ............... 455/340 |
| 6,144,845 | A | * | 11/2000 | Durec .......................... 455/285 |
| 6,195,539 | B1 | * | 2/2001 | Galal et al. ..................... 455/302 |
| 6,397,051 | B1 | * | 5/2002 | Abbasi et al. ................. 455/295 |
| 6,771,943 | B2 | * | 8/2004 | Kianush ..................... 455/192.1 |
| 6,778,594 | B1 | * | 8/2004 | Liu ............................... 375/222 |
| 6,892,060 | B2 | * | 5/2005 | Zheng .......................... 455/302 |
| 6,959,178 | B2 | * | 10/2005 | Macedo et al. ............... 455/313 |
| 2004/0239442 | A1 | * | 12/2004 | Wilcox ......................... 333/126 |
| 2006/0208791 | A1 |   | 9/2006 | Vilhonen |

OTHER PUBLICATIONS

Oualkadi, A.E. et al, "High-Q 8-path bandpass filters design for broadband wireless radio-communication." In: The European Conference on Wireless Technology, 2005. Oct. 3-4, 2005.
"International Search Report of the International Searching Authority", received in corresponding PCT Application No. PCT/FI2007/050705, Dated Apr. 22, 2008, 45 pages.

\* cited by examiner

*Primary Examiner* — Jean Jeanglaude
(74) *Attorney, Agent, or Firm* — Nokia Inc.

(57) ABSTRACT

Various embodiments are disclosed relating to techniques of filtering and down-converting a received signal. In accordance with an example embodiment of the present invention, an analog signal may be received and amplified in a transconductance amplifier. The amplified signal may be connected to a switching arrangement and an impedance circuit connected in series, and frequency down-converted in a second circuit. The resulting analog base band signal may be fed back to a base band input between the switching arrangement and the impedance circuit.

15 Claims, 14 Drawing Sheets

APPARATUS COMPRISING FREQUENCY SELECTIVE CIRCUIT AND METHOD

RELATED APPLICATION

This application was originally filed as PCT Application No. PCT/FI2007/050705 filed Dec. 19, 2007.

FIELD

The invention relates to an apparatus comprising a frequency selective circuit and a receiver comprising such an apparatus.

BACKGROUND

Digital signal processing is becoming more and more important in telecommunication apparatuses. This applies especially to wireless telecommunication. A signal is processed digitally in a transmitter, converted to an analog form and transmitted wirelessly to a receiver, which converts the signal back to a digital form.

In recent years, several different wireless telecommunications standards have emerged. These standards support systems based on GSM, CDMA and WCDMA techniques, for example. From the user's point of view, a transceiver supporting several standards provides most versatile usability. Therefore, transceivers capable of communication in systems based on different technologies have been developed.

In implementing a radio receiver supporting several radio standards, analog base band filtering and A/D-conversion bandwidths have to be carefully adjusted for each standard. This consumes silicon area and increases design complexity and design time. The more signal processing is performed in digital domain, the more efficient the design and operation of a receiver will be. It would be advantageous if the same analog front-end could be used for example for GSM, CDMA and WCDMA transmission with only minor, if any, modifications in the analog domain while performing the required adjustments (such as channel select filtering) in a digital base band circuitry.

Traditionally, radio receivers are implemented as a superheterodyne or a direct conversion receiver. Both of these are well known in the art. For example, the direct conversion receiver implemented on an integrated circuit usually comprises a low noise amplifier, a quadrature down conversion mixer and separate analog lowpass filters and A/D-converters for the I- and Q-branch.

In order to embed several receiver functions into a single block, frequency translating band pass delta sigma modulators have been proposed. A delta sigma modulator (also called ΔΣ-modulator, sigma-delta modulator, or ΣΔ-modulator) is an oversampling analog-to-digital converter capable of noise shaping. The basic idea in frequency translating delta sigma modulators is to combine both band pass and lowpass modulator stages so that at least the first modulator stage is a band pass stage while the rest are lowpass modulator stages. Naturally, this means that the signal is quadrature down converted with a subsampler or a frequency mixer at the last (or only) band pass modulator stage output. Similarly, the feedback signal has to be quadrature up converted with a frequency mixer for the input modulator stage.

Known problems in A/D converters are related to linearity and so called 1/f-noise. Frequency translating delta sigma modulators provide a partial solution to these problems. Embedding down conversion mixer in a modulator feedback loop reduces the nonlinearities of the mixer and, furthermore, a band pass modulator input stage will reduce the effects of 1/f-noise for the whole A/D-converter since input signal frequency is well above 1/f corner frequency. Similarly, in a fully continuous-time modulator, sinusoidal waveforms in feedback path frequency up converter can be used to reduce timing jitter provided that sinusoidal LO waveform zero crossings are synchronized with a D/A-converter latching instant.

However, the performance of known frequency translating delta sigma modulators is far from the requirements of radio receivers of modern telecommunication systems. There are several reasons for this.

First, most of the presented band pass modulators utilize low-Q resonators in the first stage. Thus, they are less frequency-selective than normal lowpass delta sigma modulators. This results in a band pass channel filter of higher stopband attenuation requirements than those of a lowpass channel filter in a direct conversion receiver.

Second, an unfiltered 1-bit bitstream feedback signal contains high spectral energy at frequencies that may become mixed with the desired signal band in up conversion. Therefore, resolution in prior art modulators is most likely limited by nonidealities in feedback D/A-conversion and/or in the frequency up conversion. All nonlinearities in the feedback path will further degrade the modulator performance.

BRIEF DESCRIPTION OF THE INVENTION

An object of the invention is to provide an improved apparatus overcoming the above problems and providing additional advantages. According to an aspect of the invention, there is provided an apparatus, comprising a frequency selective circuit with one or more resonator stages, a frequency down converting stage and having an analog signal as an input, wherein at least one resonator stage is realized with an impedance transferring circuit comprising: a transconductance amplifier, and a switching arrangement and an impedance circuit connected in series, the switching arrangement being configured to switch the impedance of the impedance circuit from base band to the frequency of the input signal and a base band input between the switching arrangement and the impedance circuit, configured to receive an analog feedback signal from the output of the frequency selective circuit.

According to another aspect of the invention, there is provided an apparatus, having as an input an analog signal, the apparatus comprising: a first circuit comprising an impedance transferring circuit configured to band pass filter the input signal, obtaining a filtered signal; the impedance transferring circuit comprising: a transconductance amplifier, and a switching arrangement and an impedance circuit connected in series, the switching arrangement being configured to switch the impedance of the impedance circuit of the impedance transferring circuit from base band to the frequency of the input signal; a second circuit configured to perform down mixing to the filtered signal obtaining a base band signal; a feedback loop connecting the base band signal to the switching arrangement and the impedance circuit, the signal of the feedback loop configured to control the properties of the first circuit.

According to another aspect of the invention, there is provided a method, comprising: receiving an analog signal as an input; processing the analog signal in at least one circuit by amplifying the signal in a transconductance amplifier, connecting the amplified signal to a switching arrangement and an impedance circuit connected in series, switching by the switching arrangement the impedance of the impedance circuit from base band to the frequency of the input signal; connecting the amplified signal to a second circuit; down mixing the signal to base band by the second circuit and obtaining a base band signal; connecting the base band signal to a feedback loop and obtaining an analog base band feedback signal; and receiving by a base band input between the switching arrangement and the impedance circuit an analog base band feedback signal from the feedback loop.

According to yet another aspect of the invention, there is provided an apparatus, having an analog signal as an input and one or more digital 1-bit or multibit signals as an output, comprising a first circuitry and a second circuitry connected in series, the circuitries comprising a transconductance amplifier, and a switching arrangement and an impedance circuit connected in series, the input to the first circuitry being the analog signal, two A/D converter apparatuses, whose inputs are connected between the switching arrangement and the impedance circuit of the second circuitry, the output of the converters being the one or more digital signals, and two feedback D/A converters, whose inputs are connected to the output of the A/D converter apparatuses and output between the switching arrangement and the impedance circuit of the first circuitry; the switching arrangement of the first circuitry being configured to switch the impedance of the impedance circuit of the first circuitry from base band to the local oscillator frequency, the second circuitry being configured to perform quadrature down mixing from the local oscillator frequency to base band, and the switching arrangement and the impedance circuit of the first circuitry being configured to up convert the signal from the two feedback D/A converters to the local oscillator frequency.

According to yet another aspect of the invention, there is provided an apparatus, having as an input an analog signal, the apparatus comprising: first circuitry means comprising an impedance transferring means configured to band pass filter the input signal, obtaining a filtered signal; the impedance transferring means comprising: a transconductance amplifying means, and a switching means and an impedance means connected in series, the switching means being configured to switch the impedance of the impedance means of the impedance transferring means from base band to the frequency of the input signal; a second circuitry means configured to perform down mixing to the filtered signal obtaining a base band signal; a feedback means connecting the base band signal between the switching means and the impedance means, the signal of the feedback means configured to control the properties of the first circuitry means.

Embodiments of the invention enable performing analog-to-digital conversion closer to the antenna than in the prior art solutions.

In an embodiment, the inventive concept is applied to a frequency selective circuit prior to A/D conversion. An example of such a circuit is a down mixing filter.

In an embodiment, the impedance circuits provide good frequency selectivity at radio frequencies. Therefore greater amplification can be applied at an earlier stage than in traditional receiver architectures, which results in better noise performance and significantly reduced sensitivity to 1/f-noise. Because impedance circuits are used within a feedback loop, many nonidealities are reduced by a feedback mechanism.

In addition, there is no need to change the modulator coefficients or time constants for most radio standards because the final channel selection filter is realized in digital domain.

LIST OF DRAWINGS

In the following, the invention will be described in greater detail with reference to the embodiments and the accompanying drawings, in which FIGS. 1A to 1D illustrate examples of a receiver to which embodiments of the invention may be applied;

DESCRIPTION OF EMBODIMENTS

Figure 1A:
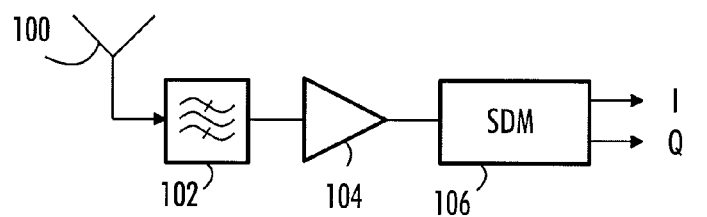

With reference to FIGS. 1A, 1B, 1C and 1D, examine examples of a receiver to which embodiments of the invention can be applied. The receiver of FIG. 1A comprises an antenna 100 receiving a signal. The antenna 100 is connected to a filter 102 configured to filter undesired frequencies from the received signal. The filtered signal is taken to a low noise amplifier 104 configured to amplify the signal. The amplified signal is taken to a sigma delta modulator 106 configured to convert the amplified analog signal to a digital form. At the output of the sigma delta modulator the received signal is in a digital form. In this example the digital signal is split into inphase and quadrature phase components. The receiver of FIG. 1A is a direct conversion receiver (also known as zero-IF receiver) where the signal at the input of the sigma delta modulator is an RF signal.

Figure 1B:
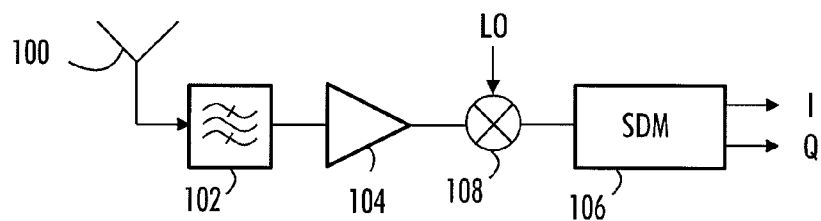

FIG. 1B illustrates a superheterodyne receiver comprising a mixer 108 mixes the received signal with a local oscillator signal LO. Thus, the signal at the input of the sigma delta modulator is an intermediate frequency (IF) signal.

Figure 1C:
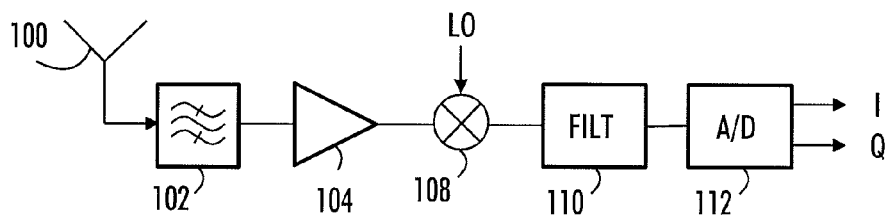

The receiver of FIG. 1C comprises an antenna 100 receiving a signal. The antenna 100 is connected to a filter 102 configured to filter undesired frequencies from the received signal. The filtered signal is taken to a low noise amplifier 104 configured to amplify the signal. The amplified signal is taken to a filter 110 configured to down mix the received signal to base band. The base band signal is taken to an A/D converter 112 configured to convert the analog signal to a digital form.

Figure 1D:
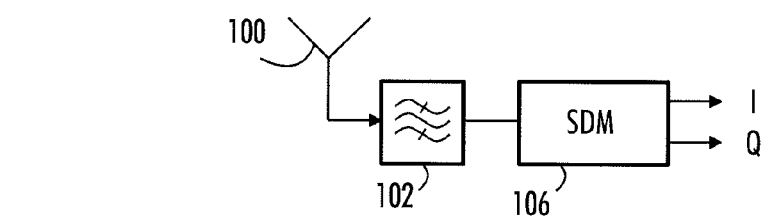

The receiver of FIG. 1D comprises an antenna 100 receiving a signal. The antenna 100 is connected to a filter 102 configured to filter undesired frequencies from the received signal. The filtered signal is taken to an A/D converter 112 configured to convert the analog signal to a digital form. The A/D converter may be a multi stage converter with the first stage acting as a low noise amplifier configured to amplify the signal. Thus, a separate low noise amplifier is not needed.

The receiver may be a part of a transceiver. In that case the filter 102 may be a duplex filter.

Alternatively, the signal after A/D-conversion may still be in a low intermediate frequency (IF) which is downconverted to baseband signal in digital domain. In such a case, the receiver of FIG. 1A is a low-IF receiver.

It should be noted that embodiments of the invention are not limited to receivers but they may be applied in any signal processing applications. The receivers of FIGS. 1A to 1C are merely examples of a device where the claimed apparatus may be utilized.

Embodiments of the invention may be applied to apparatuses utilizing sigma delta modulators, other embodiments may be utilized in apparatuses performing down mixing to a signal prior to A/D-conversion. Also other applications are possible, as one skilled in the art is aware.

Figure 2A:
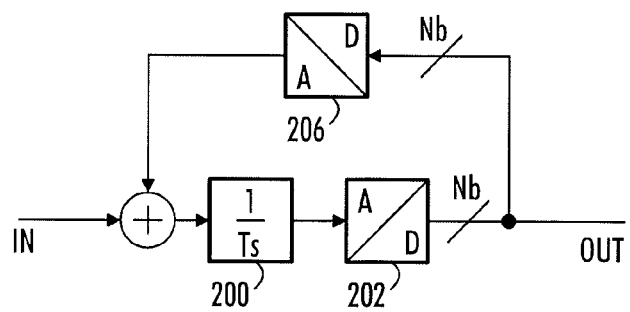
FIGS. 2A and 2B illustrate examples of the structure of delta sigma modulators.

In general, a delta sigma modulator is an oversampling analog-to-digital converter capable of noise shaping. FIG. 2A illustrates an example of a delta sigma modulator with a lossless continuous-time integrator. The delta sigma modulator comprises an integrator or a filter 200 with a transfer function $1/(T^*(s))$, N-bit A/D converter 202 and N-bit D/A converter 206 in a feedback loop. The structure of FIG. 2A is called a first-order multibit delta sigma modulator.

Figure 2B:
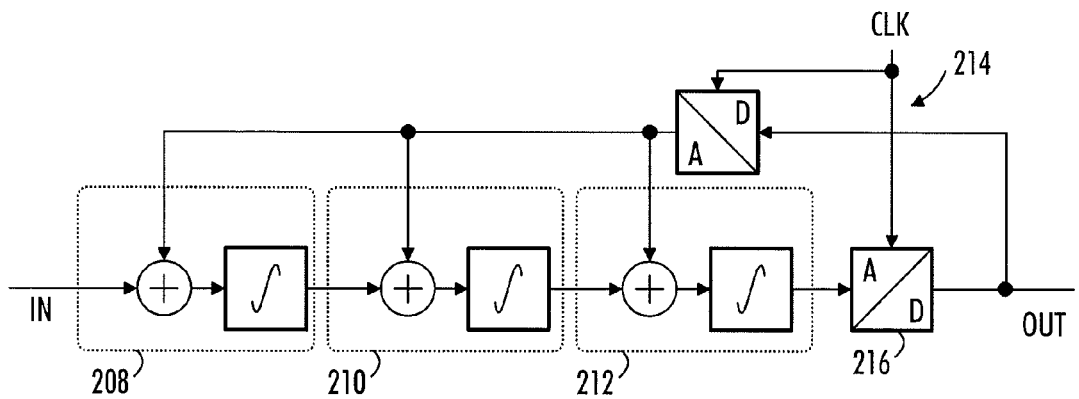

FIG. 2B illustrates an example of a third-order delta sigma modulator comprising three integrators 208, 210 and 212 with feedback 214 to each integrator stage. The quantization may be performed in this case with a 1-bit or multibit A/D-converter 216.

Figure 3:
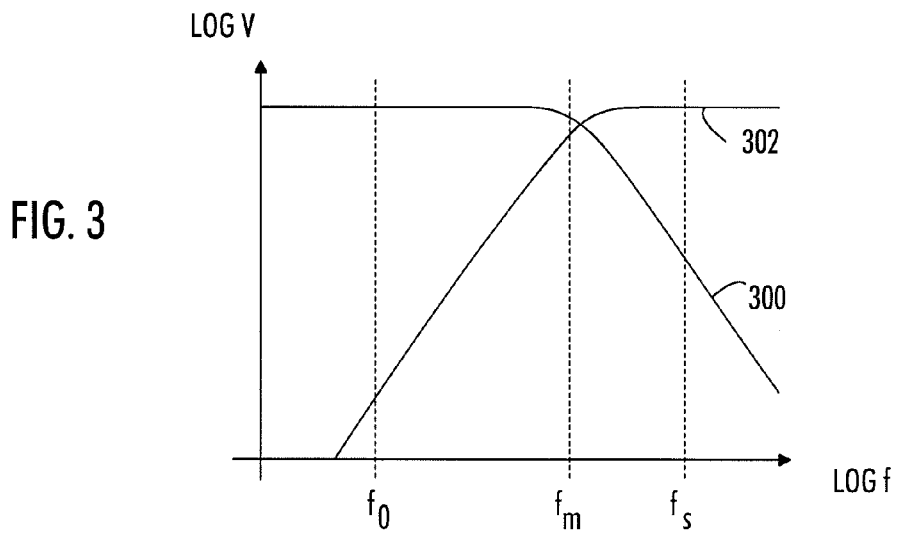
FIG. 3 illustrates examples of signal transfer function and noise transfer function of a delta sigma modulator.

The quantization error in a delta-sigma modulator may be assumed as an error signal injected into the input of the A/D-converter. Thus, the digitized signal is the sum of the (last) integrator output voltage and the quantization error. The signal transfer function (STF) is a lowpass transfer function whereas the noise transfer function (NTF) is a high pass function. FIG. 3 illustrates examples of STF 300 and NTF 302 of a typical delta sigma modulator. The STF corner frequency $f_m$ is approximately equal to the NTF corner frequency, depending on the modulator order, and normally roughly one decade lower than the sampling frequency $f_s$ (which also depends on the modulator order). The actual desired signal is normally much lower with a corner frequency $f_0$. Therefore, the signal-to-noise ratio is very good at low frequencies because of the high pass filtering of the quantization error. Thus, a delta-sigma modulator performs noise shaping and the A/D-converter resolution increases with modulator order and oversampling ratio $f_s/f_0$.

Delta sigma modulators may be implemented as 1-bit or multibit modulators. One of the benefits of 1-bit quantization is a simple and inherently linear operation. However, 1-bit modulators require fast settling of integrator amplifiers. Additionally, continuous-time 1-bit modulators tolerate less jitter in the clock signal than multi-bit continuous-time modulators or delta-sigma modulator using switched-capacitor integrators. In switched capacitor circuit based modulators, the signal is aliased already in the input whereas in continuous-time modulator aliasing happens in the quantization after a significant amount of low pass filtering in the modulator. Multi-bit continuous-time delta-sigma modulators are less sensitive to clock jitter and, similarly, amplifier settling requirements are relaxed.

Figure 4:
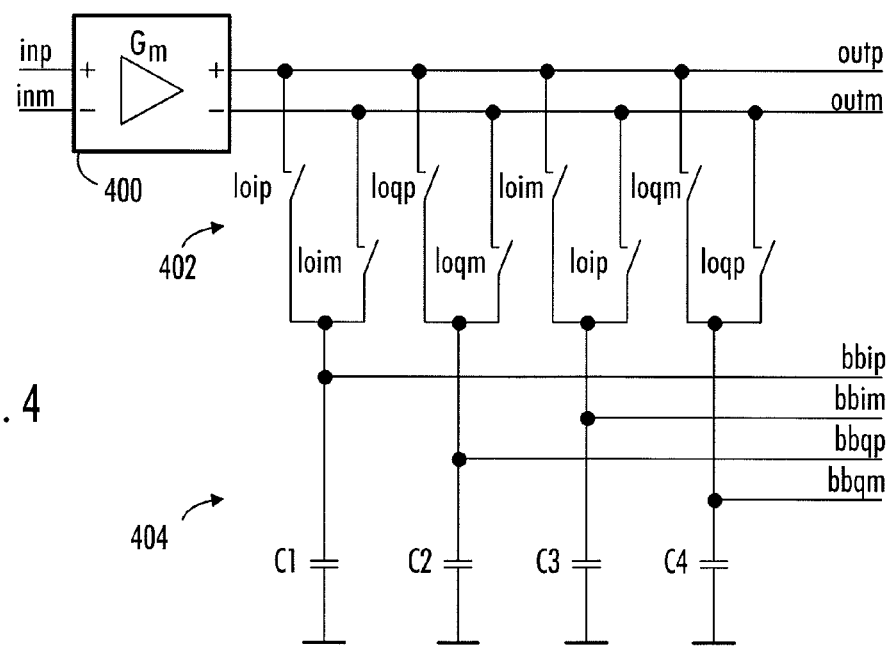
FIG. 4 illustrates an example of the structure of an impedance transferring circuit.

In an embodiment, a low pass delta sigma modulator (of which FIG. 2B presents a three order modulator example) is converted into a frequency selective down converting RF A/D-converter by using an impedance transferring circuit presented in FIG. 4 at least in the first integrator stage 208 and optionally in the second integrator stage 210.

The impedance transferring circuit of FIG. 4 comprises a transconductance amplifier 400, and a switching arrangement 402 and an impedance circuit 404 connected in series. The switching arrangement 402 is configured to switch the impedance of the impedance circuit 404 of the integrator from base band to the frequency of the input signal. The impedance transferring circuit further comprises a base band input and output ports between the switching arrangement and the impedance circuit.

The transconductance amplifier 400 in FIG. 4 comprises differential inputs (inp and inm) and differential outputs (outp and outm) and has the switching arrangement 402 and the impedance circuit 404 as a load. The impedance transferring circuit acts as a band pass filter from the differential input (inp and inm) to the differential output (outp and outm). In addition, the impedance transferring circuit comprises four ports, bbip, bbim, bbqp and bbqm, acting both, as inputs and outputs. Therefore, injecting differential inphase current signal to nodes bbip and bbim and differential quadrature current signal to nodes bbqp and bbqm the differential voltage output signal at nodes outp and outm is quadrature frequency up converted. Moreover, this signal is integrated before up conversion resulting in a cleaner up converted signal. Alternatively, the voltage signal from the input inp and inm is converted into current in the transconductance amplifier and is seen as frequency down converted and integrated inphase differential voltage signal at base band outputs bbip and bbim and quadrature differential voltage signal at base band output bbqp and bbqm.

Therefore, this multi-input and multi-output impedance transferring circuit may be used to implement band pass resonators and integrating down or up converting quadrature frequency mixers. These functions can be even utilized simultaneously.

Figure 5:
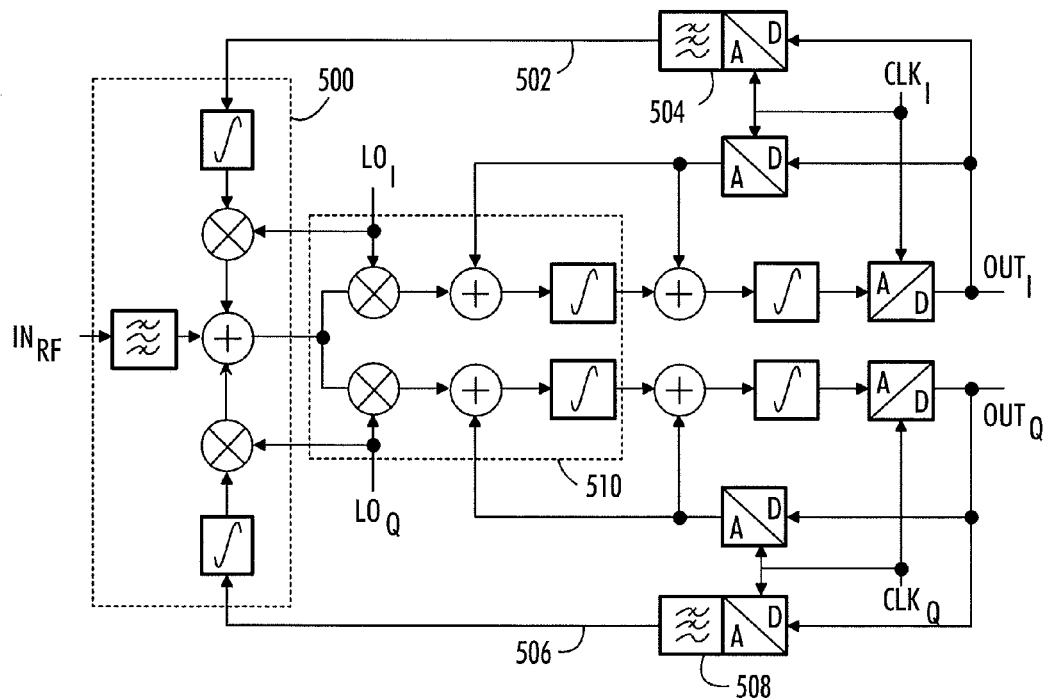
FIG. 5 shows a functional block diagram of a quadrature down converting delta sigma modulator.

FIG. 5 shows a functional block diagram of a quadrature down converting delta sigma modulator based on a third order low-pass delta-sigma modulator of FIG. 2B realized using at least one impedance transferring circuit of FIG. 4. For quadrature down conversion, two delta-sigma modulators are required in base band frequencies, one for inphase and one for quadrature branch.

The first block 208 in the 3rd order low-pass delta-sigma modulator of FIG. 2B is implemented with the transferred impedance circuit of FIG. 4 resulting in the first dashed block 500 in FIG. 4. There the inphase feedback current 502 from D/A-converter 504 is fed to nodes bbip and bbim in the transferred impedance circuit of FIG. 4. Respectively, the quadrature feedback current 506 from D/A-converter 508 is fed to nodes bbqp and bbqm in the transferred impedance circuit of FIG. 4.

Figure 6:
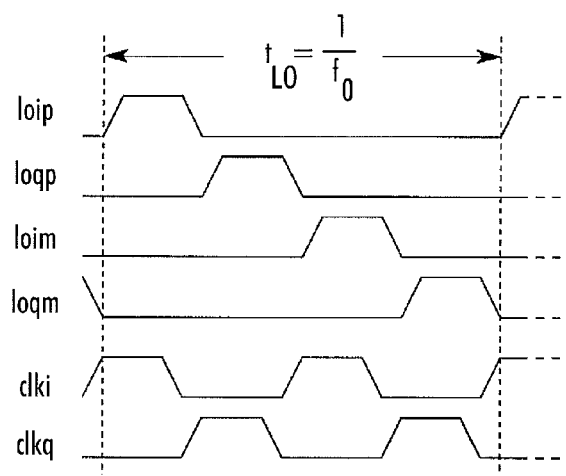
FIG. 6 illustrates examples of switching sequences and clock signals in an apparatus.

FIG. 6 illustrates the switching sequences of the switching arrangements and the clock signals, i.e. the up converting signals loip and loim for the inphase branch in FIG. 4 (equal to $LO_I$ in FIG. 5) and similarly the signals in the quadrature path loqp, loqm and $LO_Q$.

Both the RF input signal and the up converted inphase and quadrature feedback signals are summed at the differential RF output (outp and outm in FIG. 4). This signal is then fed to the second block 510 in the frequency translating delta-sigma modulator of FIG. 5. In an embodiment, this modulator 510 is also realized with the transferred impedance circuit of FIG. 4 and it is equivalent to the second dashed block 210 in the 3rd order low-pass delta-sigma modulator of FIG. 28 (the second integrator stage).

The second transferred impedance circuit 510 in the frequency translating circuit of FIG. 5 down converts the inphase and quadrature signals before integrating so that the signal is fed the RF inputs (inp and inm) of the transferred impedance circuit while the inphase current feedback signal is fed to base band inputs bbip and bbim and quadrature current feedback signal to bbqp and bbqm. The base band output signal is sensed as voltage from the same nodes (bbip, bbim, bbqp and bbqm) that the feedback current is injected. The outputs outp and outm are omitted in this circuit.

Figure 7A:
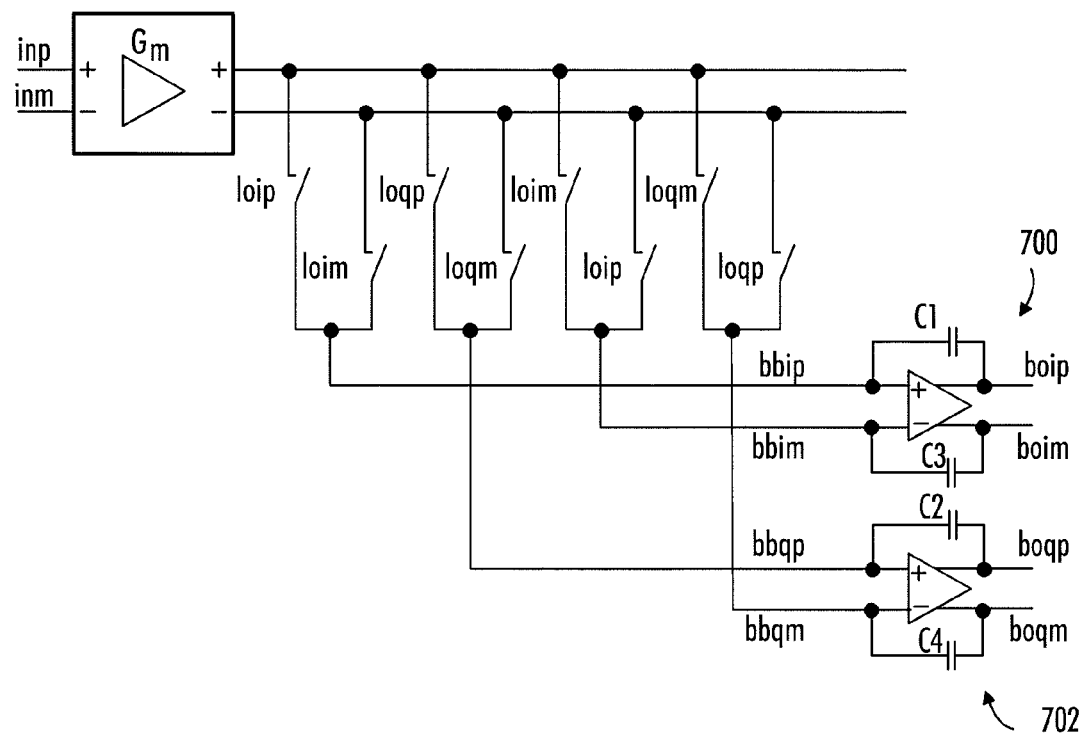
FIGS. 7A and 7B illustrate examples of the structure of a frequency translating circuit.

In an embodiment, the second block 510 of FIG. 5 is realized using an alternative structure of the frequency translating circuit. FIG. 7A illustrates alternative structure.

In FIG. 7A, the input/output-nodes bbip, bbim, bbqp and bbqm are split to input nodes blip, biim, biqp and biqm and to output nodes boip, boim, boqp and boqm while integration is performed with active Miller-integrators 700, 702. This way the base band inputs blip, biim, biqp and biqm are performing as virtual ground nodes optimizing inphase and quadrature balance and minimizing distortion.

In an embodiment, the second block 510 in the frequency translating delta-sigma modulator of FIG. 5 is not implemented using the frequency translating circuit of FIG. 4. Instead, any existing quadrature down converting mixer may be used and the integrator may be implemented similarly as integrators are normally implemented in delta-sigma modulators. The same applies to the third integrator stage or any other remaining integrator stage in the signal path if higher than 3rd order modulator structure is used.

Figure 7B:
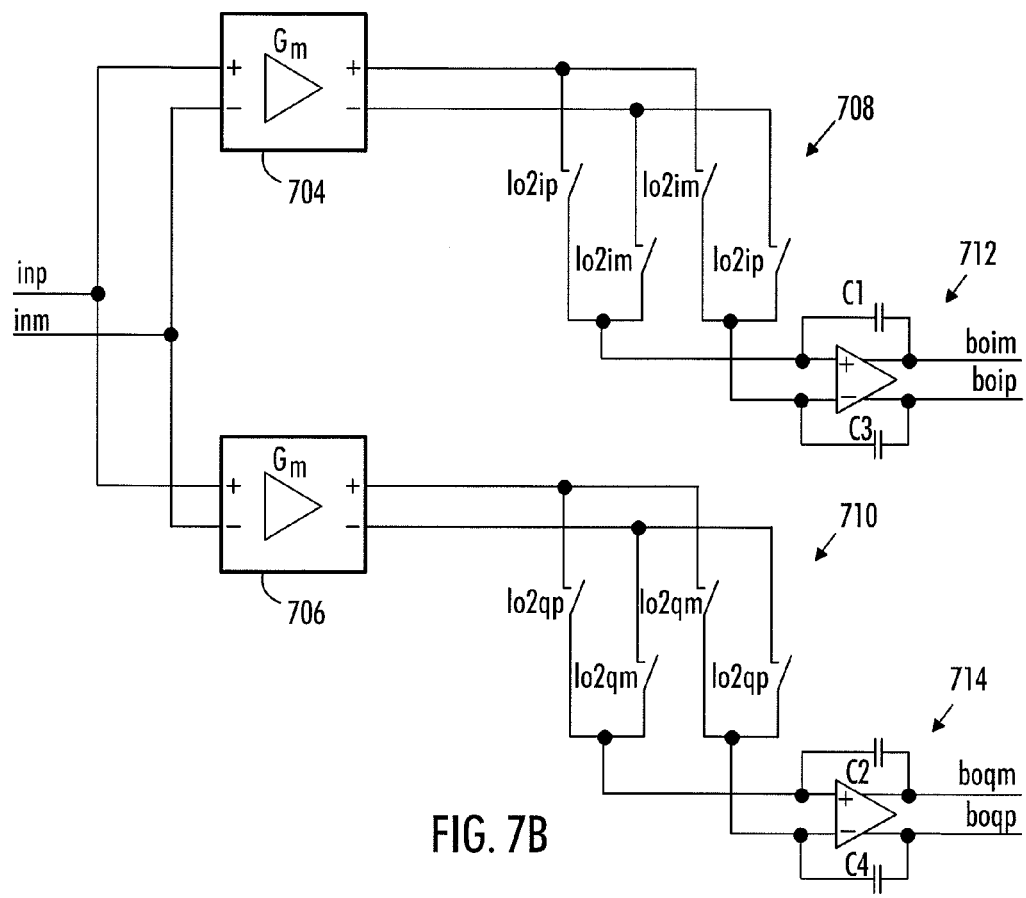
Figure 7C:
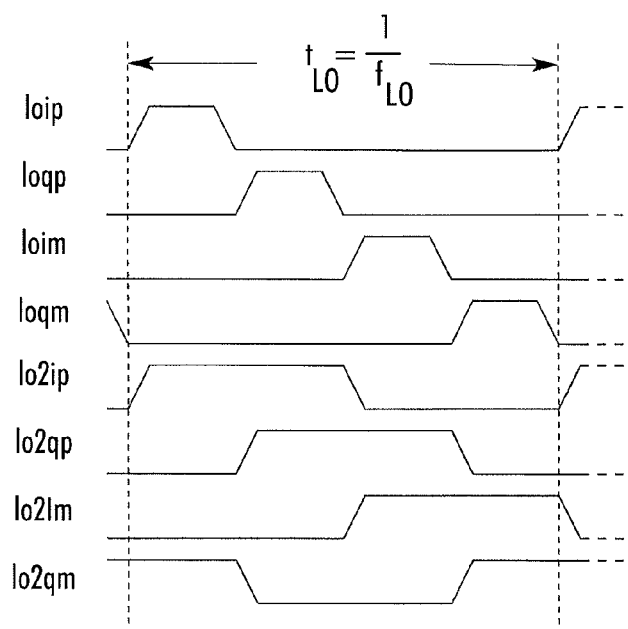
FIG. 7C illustrates an example of switching sequences and clock signals in the circuit of FIG. 7B.

FIG. 7B illustrates the implementation of the second block 510 of FIG. 5 as a normal quadrature down converting mixer utilizing similar circuit blocks that the previously described impedance transferring circuit. The implementation comprises two transconductance amplifiers 704, 706. The amplifier 704 is followed by a switching arrangement 708 and active Miller integrator 712, and amplifier 706 is followed by a switching arrangement 710 and active Miller integrator 714. FIG. 7C illustrates the switching sequences of the switching arrangements and the clock signals, i.e. signals loip and loqp, loim, loqm, lo2$ip$, lo2$qp$, lo2$im$ and lo2$qm$.

When a quadrature down conversion mixer of FIG. 7B is used in the frequency translating delta-sigma modulator the local oscillator waveforms with duty cycles close to 25% cannot normally be used but a second set of local oscillator waveforms with traditional 50% duty cycle and 90° phase difference are required as FIG. 7C illustrates. Therefore, a more complex clock dividers are required than when impedance transferring circuits are used for both two integrator/resonator stages.

Although using a normal quadrature down converting mixer requires one transconductance amplifier more and increases the complexity of the clock divider circuitry, a good performance is reached. While in the transferred impedance circuit based solution the circuitry follows the input signal only at two quarters of the local oscillator switching period $t_{LO}$, the circuitry realized with a normal quadrature down converting mixer integrates the down converted signal almost continuously. Therefore, in the latter case the feedback loop follows input signal more tightly resulting in low distortion.

The ratio of the impedance transferring circuit switching frequency and the converter clock frequency does not have to be fixed to ½; it may vary, especially if the D/A-converter can reject undesirable frequencies before up conversion as will be discussed below. Similarly, A/D- and D/A-converter clock signal may be arranged in many different ways. However, every feedback D/A-converter (such as the converters 504, 508, 512 and 514 in FIG. 5) should preferably change its output while the impedance transferring circuit switches connected to this D/A-converter output are off.

Next the feedback D/A converter implementation is studied.

Figure 8:
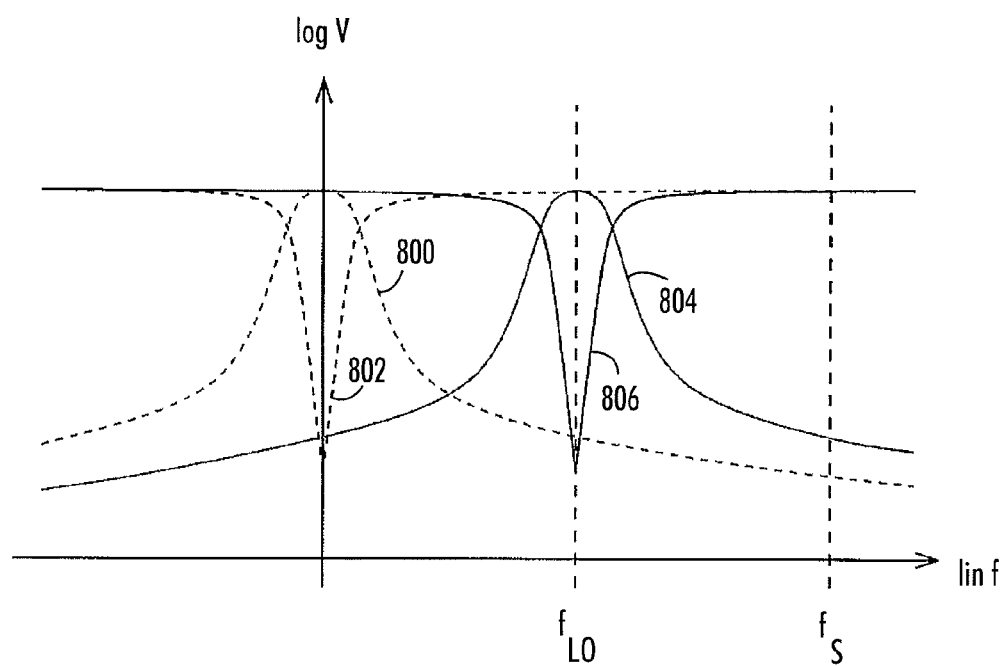
FIG. 8 illustrates examples of signal transfer function and the noise transfer function of a frequency translating delta sigma modulator.

FIG. 8 illustrates the signal transfer function and the noise transfer function of both base band (dashed lines) and frequency translating (solid lines) delta sigma modulators. The dashed lines 800 and 802 are the base band signal transfer and noise transfer functions. The solid lines 804, 806 represent the frequency translating signal transfer and noise transfer functions. When the impedance transferring circuits of FIG. 4 operate at frequency half of the sampling frequency $f_S$ as depicted in FIG. 8, the signal and noise transfer functions of the base band delta-sigma modulator are moved to the local oscillator frequency $f_{LO}$.

Because of the noise shaping of the base band delta-sigma modulator, there is a lot of quantization noise at $f_{LO}=f_{CLK}/2$, $f_{CLK}$ being the clock of the A/D-converter and equal to sampling frequency $f_s$. Therefore, simple mixed-mode FIR-filters realized with digital delay lines and current output D/A-converters may be used to implement notches at $f_{LO}$ and its multiples thus filtering base band quantization noise at frequency ranges that might interfere with the frequency translating delta-sigma modulator operation.

Figure 9A:
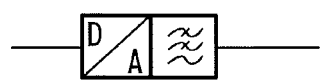
FIGS. 9A, 9B and 9C illustrate D/A conversion with mixed-mode FIR filtering.
Figure 9B:
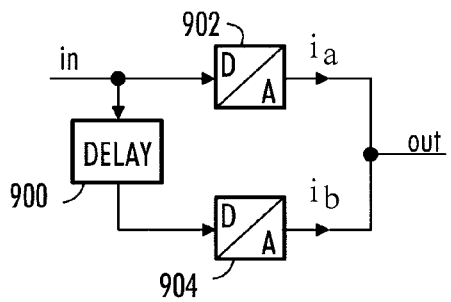
Figure 9C:
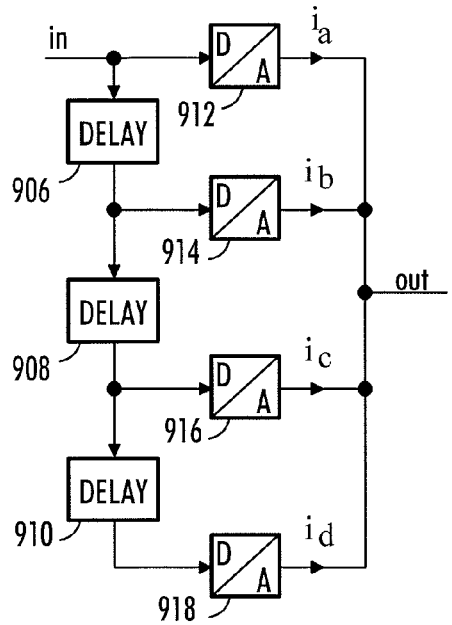

FIGS. 9A, 9B and 9C illustrate D/A conversion with mixed-mode FIR filtering. FIG. 9A shows the symbol used in the other Figures. FIG. 9B illustrate a simple implementation and FIG. 9C illustrates a more general mixed-mode FIR D/A converter.

Figure 10A:
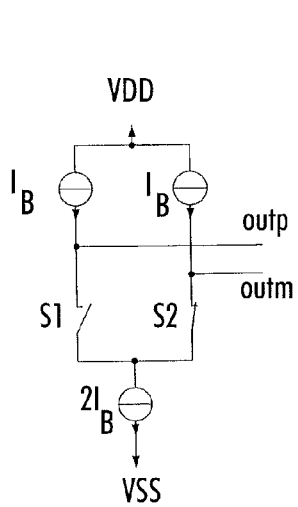
FIGS. 10A to 10C illustrate examples D/A converters.
Figure 10B:
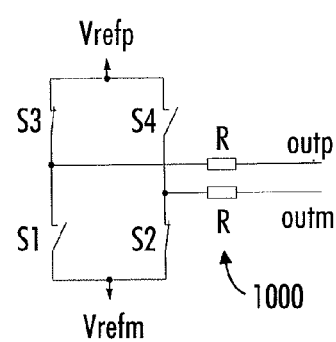

FIGS. 10A and 10B illustrate examples of a current steering 1-bit D/A converter (or one bit cell in a multibit D/A converter). FIG. 10A shows a converter with a simple differential output and FIG. 10B shows a converter with push-pull differential output.

Figure 10C:
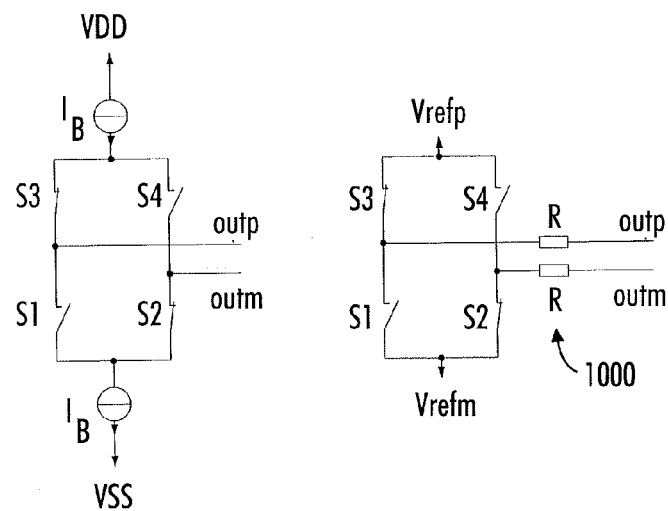

In an embodiment, the current-output D/A converters of the mixed-mode comb filter are replaced with voltage-output D/A converters. FIG. 10C illustrates a differential resistive D/A converter. The voltage-output D/A converter of FIG. 10C comprises resistors 1000 which perform analogue summing. When voltage-output D/A converters are utilized in a comb filter, the output voltage of the converters are inverted. This may be performed by cross connecting differential outputs, for example. Also other methods may be used, as one skilled in the art is aware.

In the case of $f_{LO}=f_{CLK}/2$, the required FIR-filtering can be realized with a simple realization shown in FIG. 9B where the required delay of the delay element 900 is one sample, i.e. $t_{delay}=1/f_{CLK}$ and $H(z)=z-1$. The output currents of both D/A-converters 902, 904, $i_a$ and $i_b$ have equal magnitude. Thus, the bias current $I_B$ of both current steering D/A-converters is equal (see FIG. 10A). With this arrangement a transfer function of $H(z)=1+z-1$ results having a single zero at $f_{LO}=f_{CLK}/2$.

Alternatively, by using the mixed-mode FIR-filtering D/A-converter structure in FIG. 9C with one sample digital delays ($t_{delay}=1/f_{CLK}$) in the delay elements 906, 908, 910 and equal bias current in each D/A-converter 912, 914, 916, 918, the filter transfer function has zeroes at frequencies ¼$f_{CLK}$, ½$f_{CLK}$ and ¾$f_{CLK}$ as well as ⅝$f_{CLK}$, ⅜$f_{CLK}$, and ⅞$f_{CLK}$ etc. The actual clock frequency and its multiples are attenuated by operation of the delta-sigma modulator and D/A-conversion.

The delay in the delay elements does not have to be exactly $t_{delay}=1/f_{CLK}$ but it can be several clock cycles or only a half clock cycle. If the sampling clock is divided from a higher frequency, even finer adjustment of this delay time is possible enabling more flexible frequency setting for sampling clock and impedance transferring circuit local oscillator frequency. It may be even possible to lock $f_{LO}$ to the FIR-filter delay with a continuously variable digital delay cell controlled by a delay locked loop (DLL). Similarly, individual D/A-converter output currents can be scaled to alter the FIR-filter transfer function.

In an embodiment, where multibit D/A-converters and very high impedance transferring circuit switching frequencies are utilized, the above described mixed-mode FIR-filtering D/A-converters are not used but D/A converters similar to converters used for feedback D/A-converters in later integrator stages utilizing conventional structure. However, in most cases significant performance improvement is achieved with properly select FIR-filter delays and filter coefficients.

Ideally, the feedback current should be injected to the capacitors in impedance transferring circuit only when the input signal current is switched on as well. However, this discrepancy is easily corrected just by scaling the feedback current. The same result as integrating feedback signal only half of the clock period can be achieved by scaling the feedback signal to one half of the original value and integrating it the whole clock period without switching. Especially when a FIR D/A-converter is used and the local oscillator frequency is varied in respect to the A/D-converter clock, the switching of the D/A-converter output becomes difficult. Thus, continuous feedback integration is preferred. Similarly, it can be shown that no performance benefits are gained by switching the feedback current in sync with an impedance transferring circuit.

Figure 11:
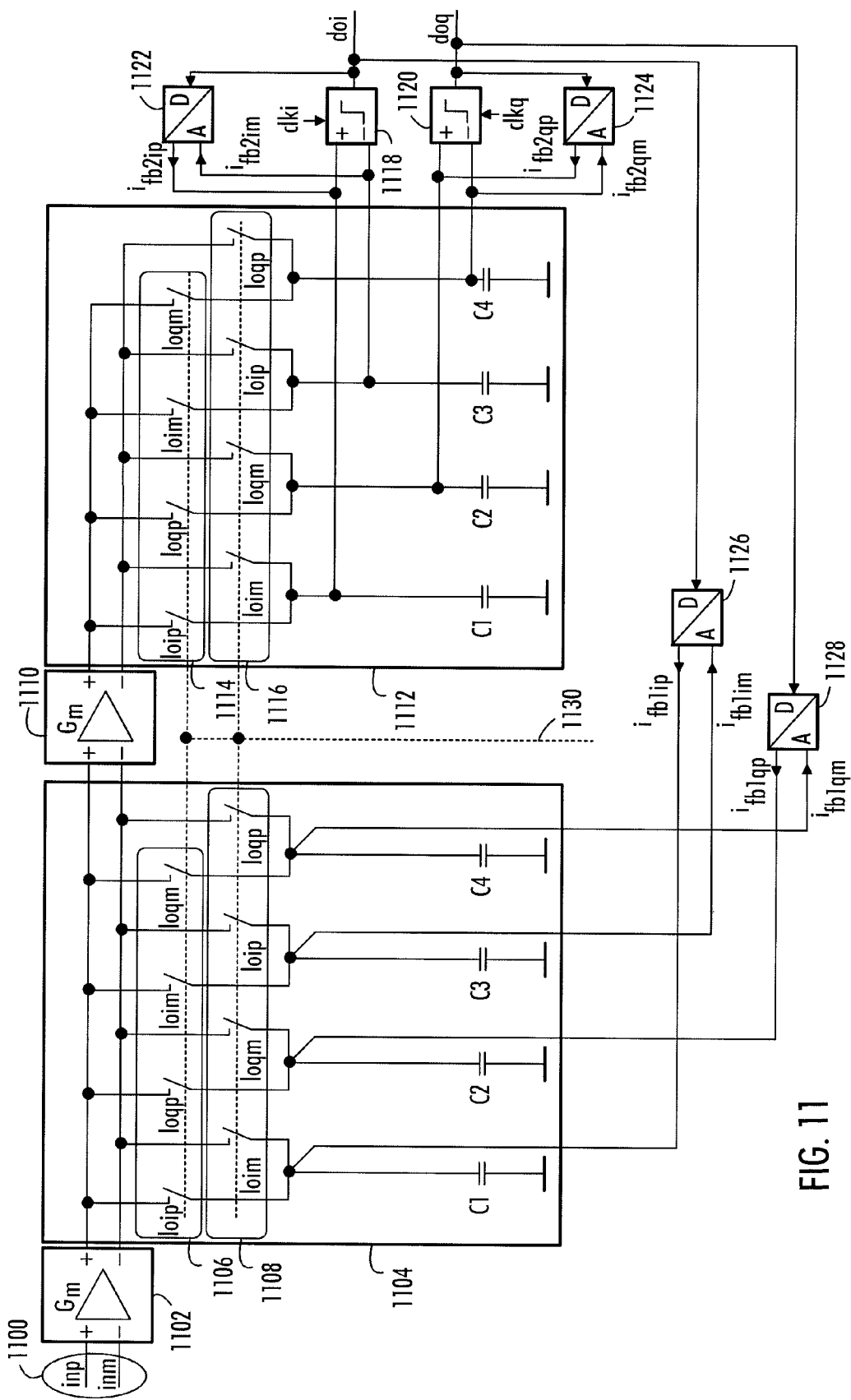
FIG. 11 illustrates an example of an apparatus where an embodiment of the invention is utilized.

FIG. 11 represents an example of an embodiment illustrating an apparatus that implements a frequency translating delta-sigma modulator employing two transferred impedance circuits and two second-order 1-bit continuous-time delta sigma modulators for inphase and quadrature branches. In this embodiment, the integrators of the delta sigma modulator are converted to resonators using impedance transferring circuitries of FIG. 4.

The apparatus of FIG. 11 comprises two base band delta sigma modulators with a 90° phase difference. The modulators are combined so that they share transconductance amplifiers via two impedance circuitries. Both transconductance amplifier stages carrying a circuit load act as band pass filters for the input signal around local oscillator frequency $f_{LO}$, while the two delta sigma modulators operate as they were normal base band modulators.

The apparatus of FIG. 11 has an analog signal 1100 in differential format as an input. Thus, the input signal comprises two branches, inp and inm, which correspond to input positive and input negative, respectively. The input signals are applied to a first transconductance amplifier 1102. The transconductance amplifier outputs a current proportional to its input voltage. The amplifier has a differential output comprising a positive and a negative output.

A first circuitry 1104 is connected to the output of the first transconductance amplifier 1102. The circuit 1104 comprises an impedance circuit of four capacitors and a switching arrangement. The switching arrangement comprises a set of switches 1106 configured to connect the impedance circuit to the positive output of the first transconductance amplifier 1102 and a set of switches 1108 configured to connect the impedance circuit to the negative output of the first transconductance amplifier 1102.

The output of the first transconductance amplifier 1102 is connected to the differential input of a second transconductance amplifier 1110. The second amplifier 1110 has a differential output comprising a positive and a negative output.

A second circuit 1112 is connected to the output of the second transconductance amplifier 1110. The second circuit 1112 comprises an impedance circuit of four capacitors and a switching arrangement. The switching arrangement comprises a set of switches 1114 configured to connect the impedance circuit to the positive output of the second transconductance amplifier 1110 and a set of switches 1116 configured to connect the impedance circuit to the negative output of the second transconductance amplifier 1110.

The apparatus of FIG. 11 further comprises a first and a second comparator 1118, 1120, whose input are connected between the switching arrangement and the impedance circuit of the circuit 1112, the converters producing a 1-bit signal as their output. Each comparator serves as a 1-bit A/D converter. The output of the first comparator 1118 is the inphase component and the output of the second comparator 1120 is the quadrature component of the digital signal.

The apparatus of FIG. 11 further comprises feedback loops from the output of the comparators to the input of the comparators. Each feedback loop comprises a D/A-converter 1122, 1124 with a differential current output. These inphase and quadrature D/A-converters perform normal base band low pass delta sigma modulator feedback.

The apparatus of FIG. 11 further comprises two differential current output feedback D/A converters 1126, 1128, whose inputs are connected to the output of the comparators 1118, 1120 and output between the switching arrangement and the impedance circuit of the first transferring circuit 1104. The first circuit 1104 upconverts these inphase and quadrature feedback signals to the desired input signal range around the local oscillator signal frequency.

FIG. 11 shows an example of a switching arrangement in which the first and the second circuits 1104, 1112 each comprise two sets of switches, 1106, 1108, 1114 and 1116. The switches are controlled by a control signal 1130. The impedance circuit of the first and the second circuits comprises four capacitors placed in parallel. The first impedance transferring circuit comprises capacitors having capacitances C1, C2, C3 and C4. The second impedance transferring circuit comprises capacitors having capacitances C5, C6, C7 and C8.

Each capacitor is placed behind two switches. In an embodiment, the switches are controlled such that each switch is open 25% of the time cycle. At each time instant, the switches connect one capacitor to the positive output of the transconductance amplifier output and one capacitor to the negative output of the transconductance amplifier output. If resistive load R were present, the circuit would act as a band pass filter with a center frequency set by a switching sequence, a bandwidth of 1/(pRC) and a pass band gain of Gm*R (Gm being the amplification of the transconductance amplifier) provided that C1=C2=C3=C4=C5=C6=C7=C8=C. Without the resistor load, the circuit acts as a band pass equivalent of a lossless integrator.

FIG. 6 illustrates the switching sequences of the switching arrangements and the clock signals of the comparators 1118, 1120.

The two transconductance amplifier stages 1104, 1112 carrying the circuit loads 1104, 1112 form a fourth order pass band filter. The second amplifier stage 1112 performs band pass filtering and quadrature downmixing, the resulting complex base band signal being quantized by the two differential input comparators 1118, 1120, which thus perform a complex 1-bit A/D-conversion.

The whole apparatus of FIG. 11 performs fourth order band pass filtering at a center frequency of $f_0=1/t_{LO}$, while the delta sigma modulator operates as if it where a standard 1-bit second order continuous-time delta sigma modulator with a sampling frequency of $2*f_0$.

The apparatus of FIG. 11 comprises two A/D converters with a 90° phase difference. However, the number of A/D converters and the number of impedance transferring circuits is not limited to two. Embodiments comprising four A/D converters with a 45° phase difference or any even number of converters may be implemented. In addition, the order of the modulator is not limited to two. Embodiments where the resulting modulator has multiple stages and is of order 3, 4, 5 or greater are also possible.

Figure 12:
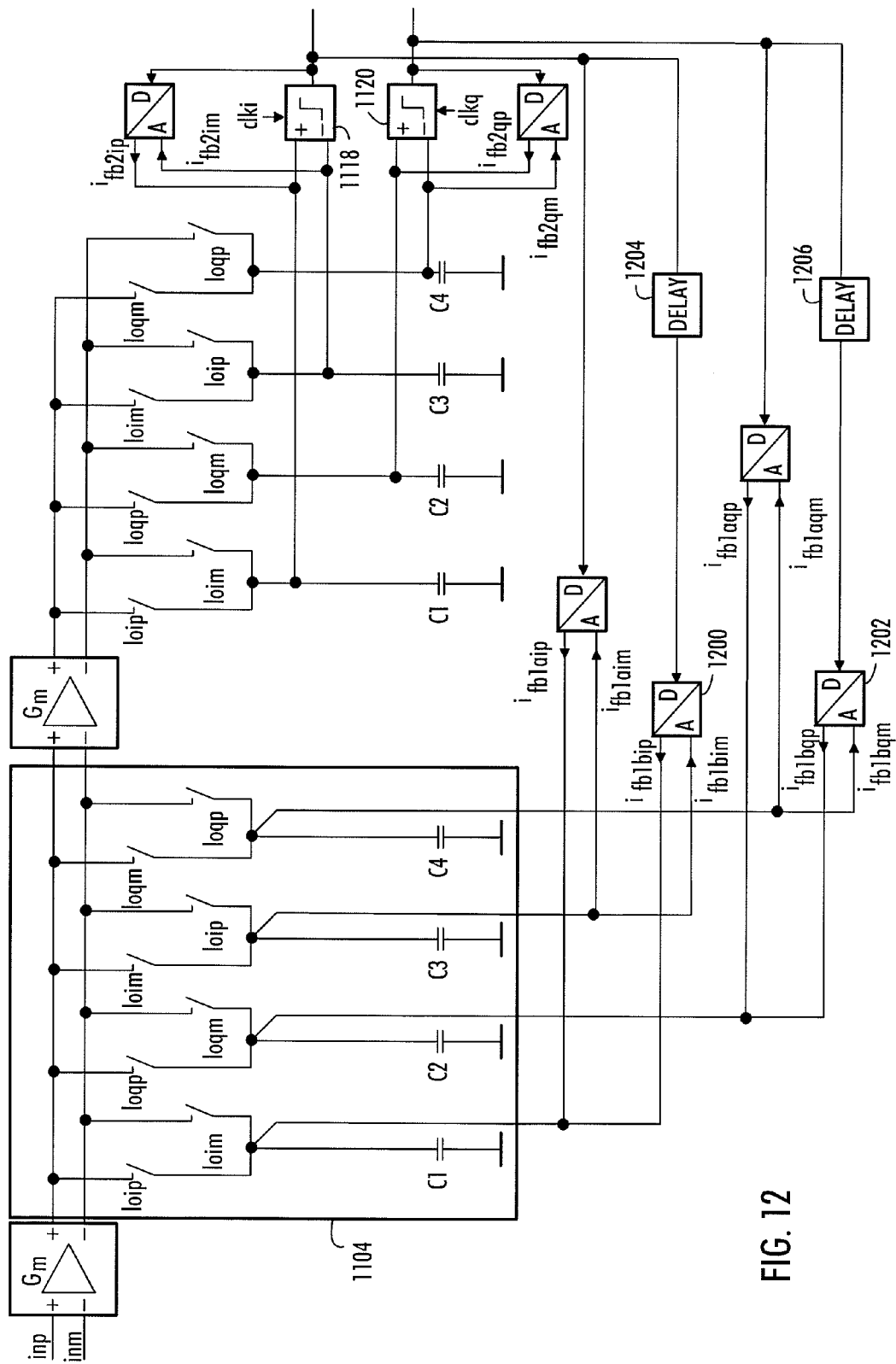
FIGS. 12, 13 and 14 illustrate examples of a frequency translating delta sigma modulator.

FIG. 12 illustrates another example of a frequency translating delta sigma modulator. In this example, notch filtering is added to the feedback loop connected to the first circuit 1104. In this example, the notch filtering is realized using two additional feedback differential current output D/A converters 1200, 1202 whose inputs are connected to the output of the comparators 1118, 1120 via delay elements 1204, 1206. The output of the D/A converters 1200, 1202 is connected between the switching arrangement and the impedance circuit of the first circuit 1104.

Figure 13:
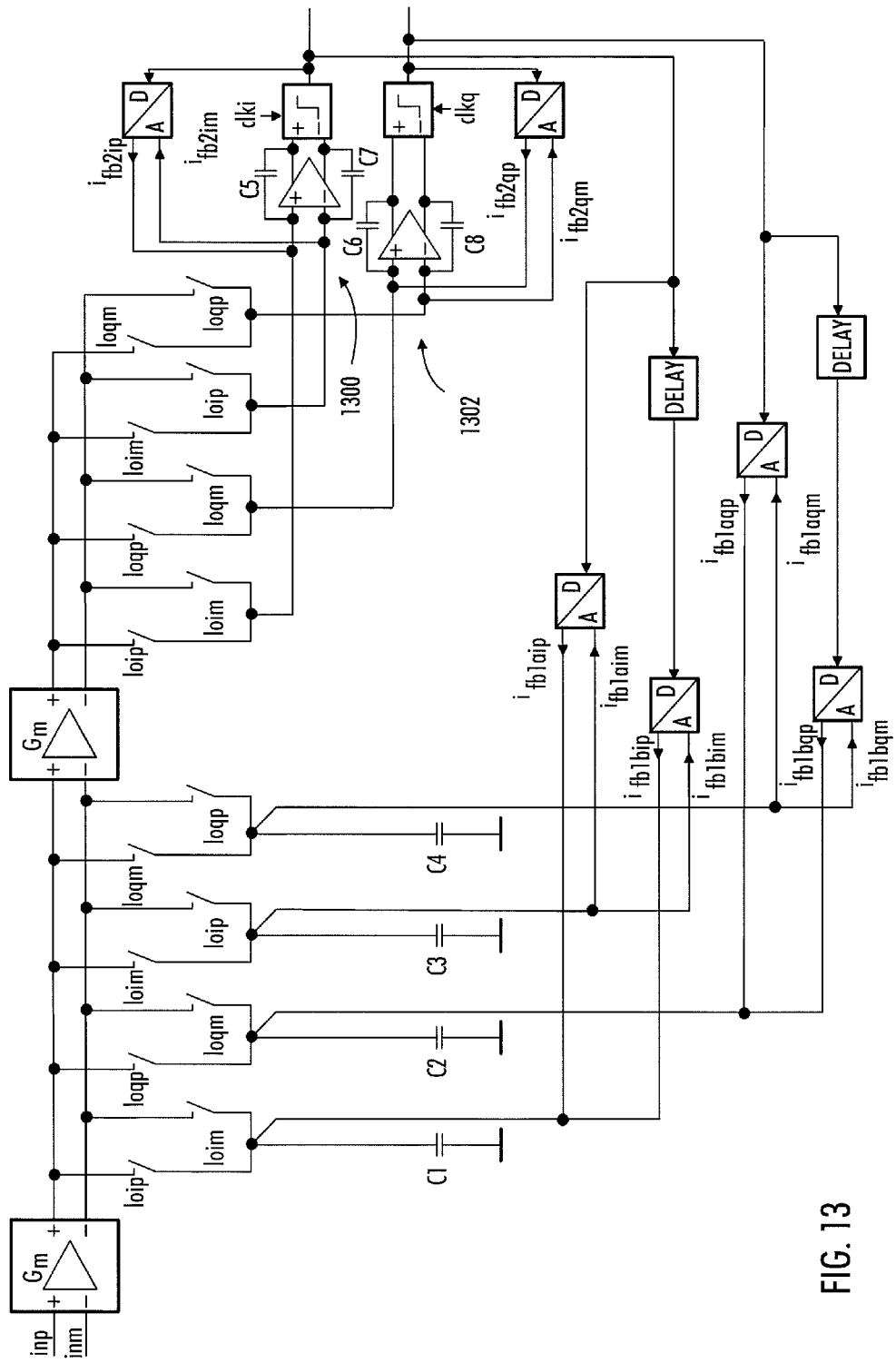

FIG. 13 illustrates another example of a frequency translating delta sigma modulator. In this embodiment, image rejection in down conversion is improved by utilizing active Miller-integrators 1300, 1302 connected to the input of the comparators 1118, 1120.

Figure 14:
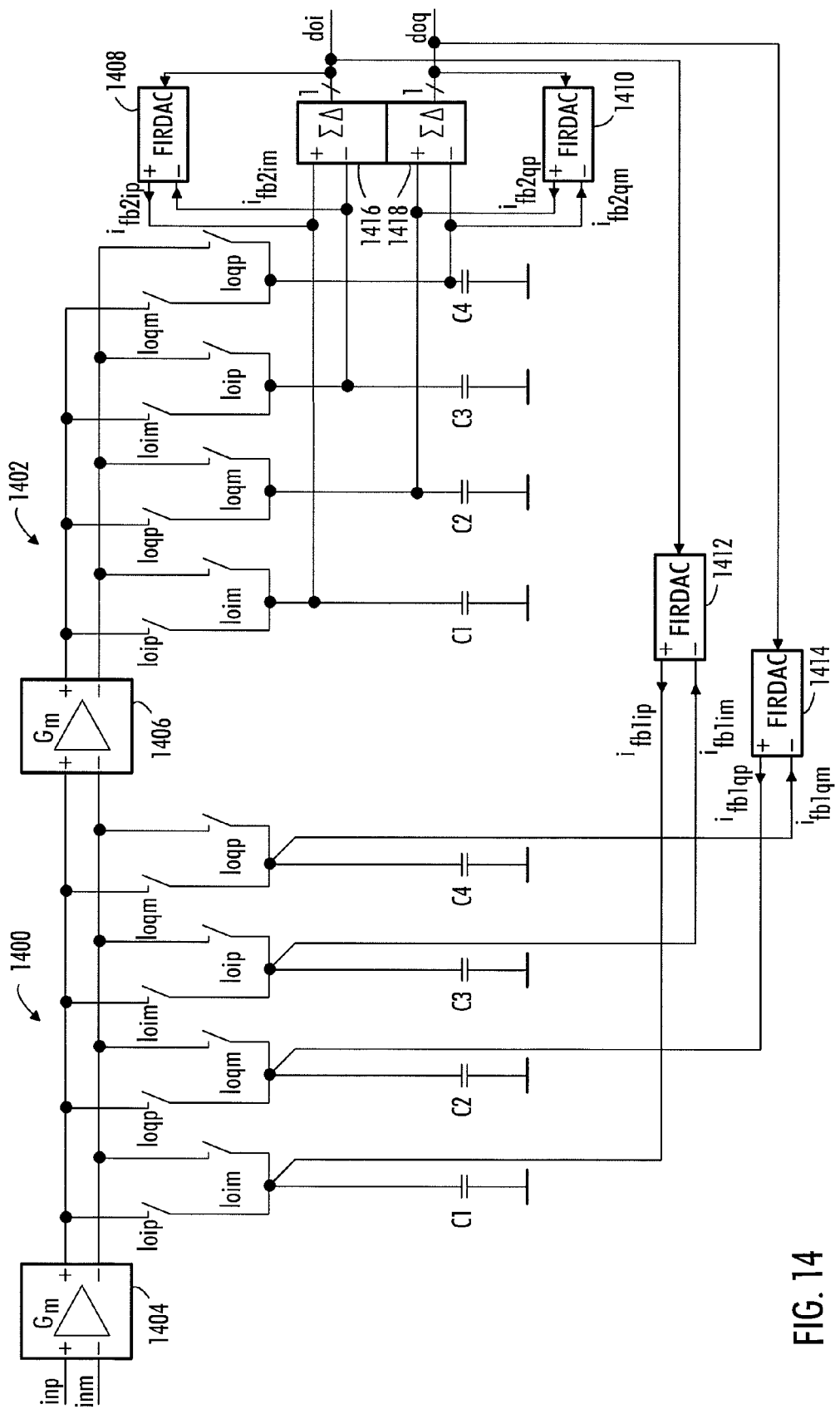

FIG. 14 illustrates an example of a higher order implementation of a frequency translating delta sigma modulator. In the example of FIG. 14, first two modulator stages are constructed with two cascaded circuitries 1400, 1402 which act as resonators. The circuitries 1400, 1104 are preceded by transconductance amplifiers 1404, 1406. The first circuitry 1400 acts as a band pass filter for the input signal and, at the same time, it up converts the inphase and quadrature feedback signals to the desired input signal range around the local oscillator signal frequency.

The structure resembles the example of FIG. 11. The D/A converters have been replaced with mixed-mode FIR-filtering 1408, 1410, 1412, 1414 and the comparators with a delta-sigma modulator apparatus 1416, 1418 containing the third and possibly further integrator stages of the higher order delta-sigma modulator with their feedback D/A-converters. The D/A converter (FIRDAC) apparatus may comprise digital delays in series and D/A-converters with their outputs summed together in similar way as described in association with FIG. 9C. Because the inner modulators may be continuous-time delta sigma modulators, the sampling rate does not have to be $2*f_0$, i.e. twice the impedance transferring circuitry switching frequency, as in the example of FIG. 11. Thus, if the required resolution is adequate and the continuous-time modulator forward signal path adequately attenuates transferred impedance switching sequences, lower sampling rates can be used or higher input RF signals can be received.

Figure 15A:
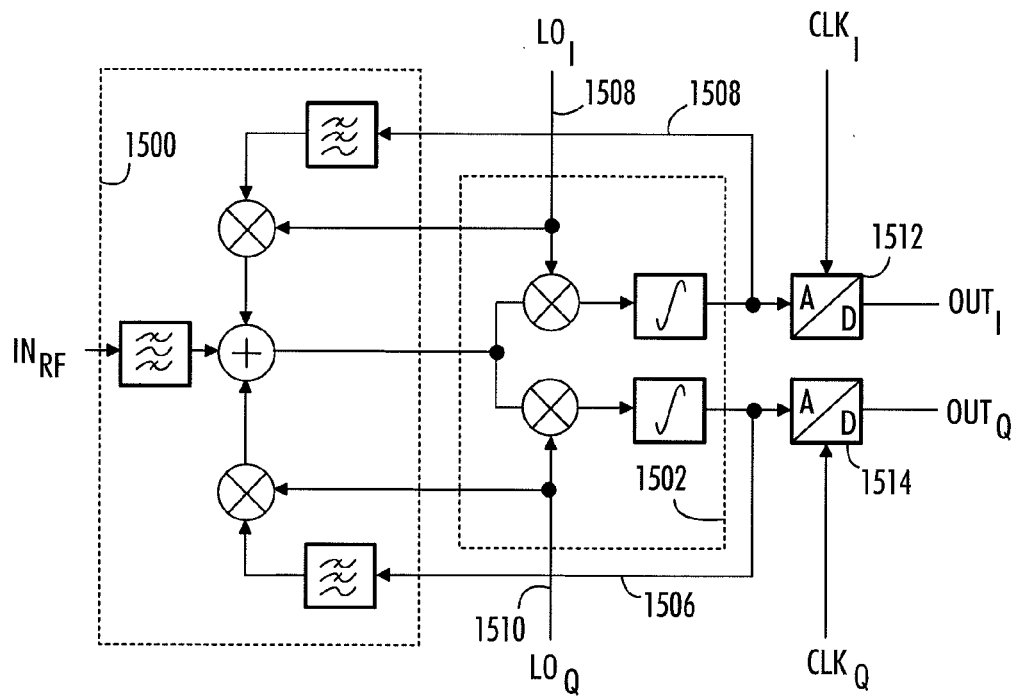
FIG. 15A illustrates an example of the operation of a frequency selective circuit.
Figure 15B:
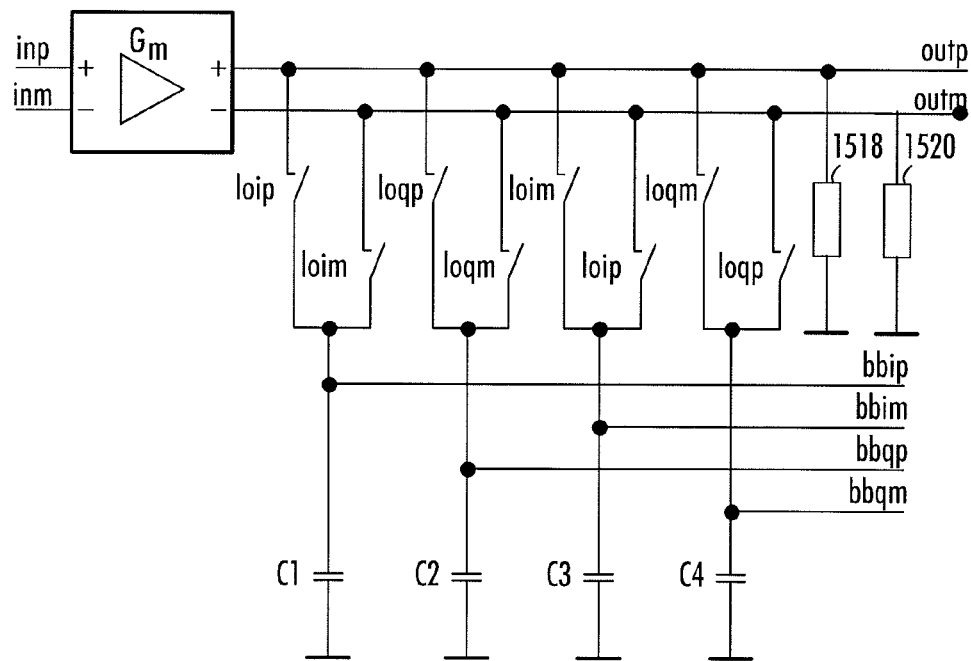
FIGS. 15B and 15C illustrate examples of a impedance transferring blocks of the circuit of FIG. 15A, FIGS. 16A and 16B are flowcharts illustrating embodiments of the invention.

FIG. 15A illustrates an embodiment, where two impedance transferring circuits 1500, 1502 are used as a down converting filter. This embodiment corresponds to the receiver structure of FIG. 1C. An example of the possible realization of the first impedance transferring circuit 1502 is illustrated in FIG. 15B. The circuit comprises resistors 1518 and 1520. In the apparatus of FIG. 15A, the feedback signals 1504, 1506 from the base band output of the second impedance transferring circuit 1502 are fed as current to the base band inputs of the first circuit 1500. As a result, the circuit 1500 performs a fourth order band pass filtering function with a fixed bandwidth and variable centre frequency controlled by I-branch and Q-branch LO-oscillation frequency 1508, 1510, while simultaneously performing quadrature down conversion. The down converted signal is then further converted to digital domain with almost any kind of an A/D-converter 1512, 1514. However, the ideal A/D-converter for this task is a continuous-time delta-sigma modulator thus eliminating any additional filtering stages before the A/D-converter.

The resistors 1518 and 1520 in the impedance transferring circuit shown in FIG. 15B are used for setting the filtering function gain, shape and bandwidth along with the feedback current injected to ports bbip, bbim, bbqp and bbqm.

Figure 15C:
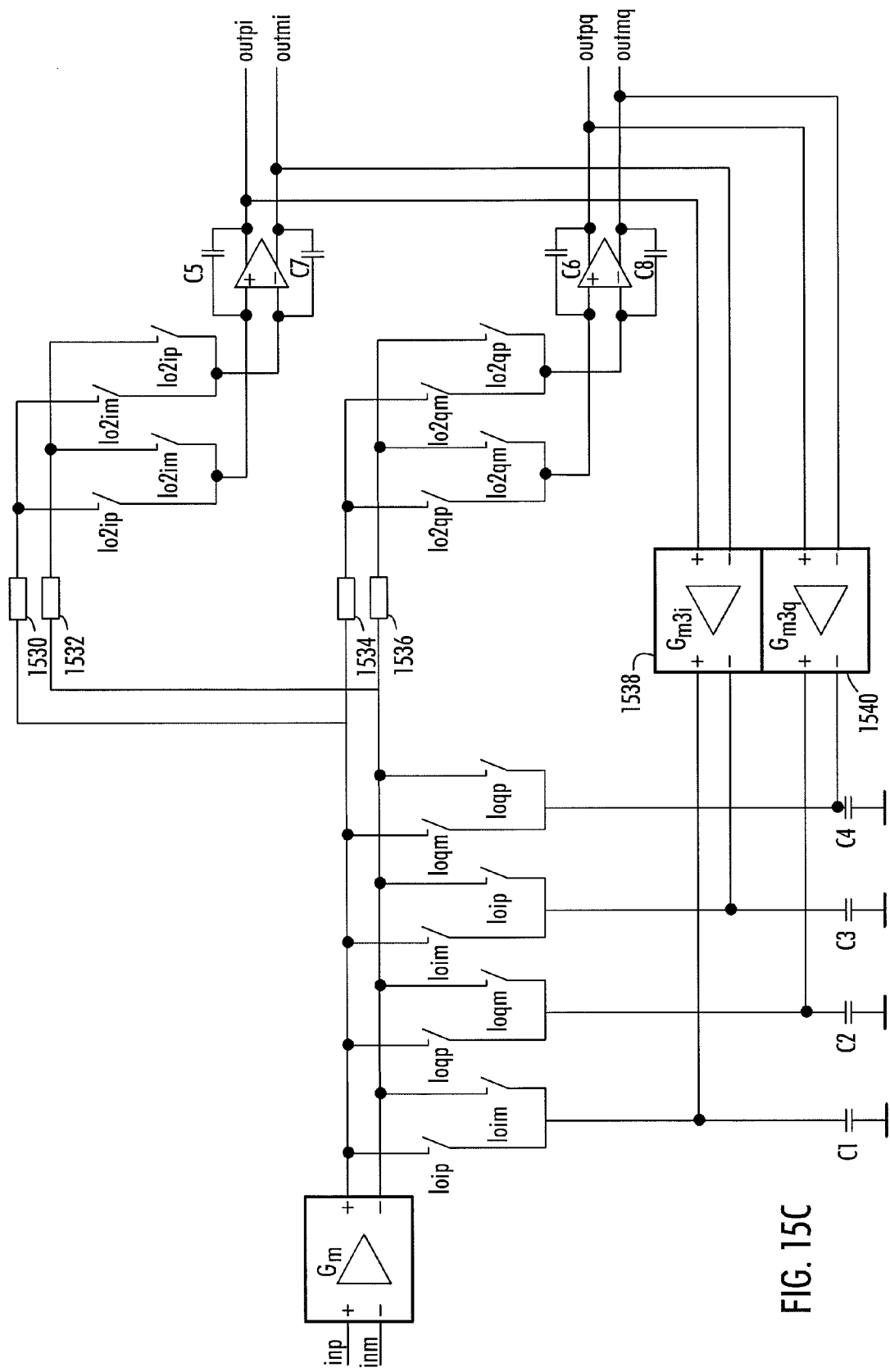

An example of a possible implementation of the second block 1502 of FIG. 15A is illustrated in FIG. 7A. However, because of the resistive load at the RF-output of the first transferred impedance circuit 1500, the second block 1502 does not require a high impedance input. Therefore, in an embodiment, the down converting mixer function is implemented with a passive mixer. An example of a simple implementation of a down converting filter realized with a passive mixer is illustrated in FIG. 15C. The transconductance amplifiers of the second block 1502 have been replaced with resistors 1530, 1532, 1534 and 1536. In addition, the feedback loop comprises transconductance amplifiers 1538, 1540. The switching sequences of the apparatus of FIG. 15C are illustrated in FIG. 7C. The resistive load at the RE-output of the first impedance transferring circuit 1500 is implemented with the input impedance of the passive quadrature down converting mixer. The only drawback of this implementation is that filter parameters cannot be as freely set as with separate load resistors and transconductance amplifiers.

Figure 16A:
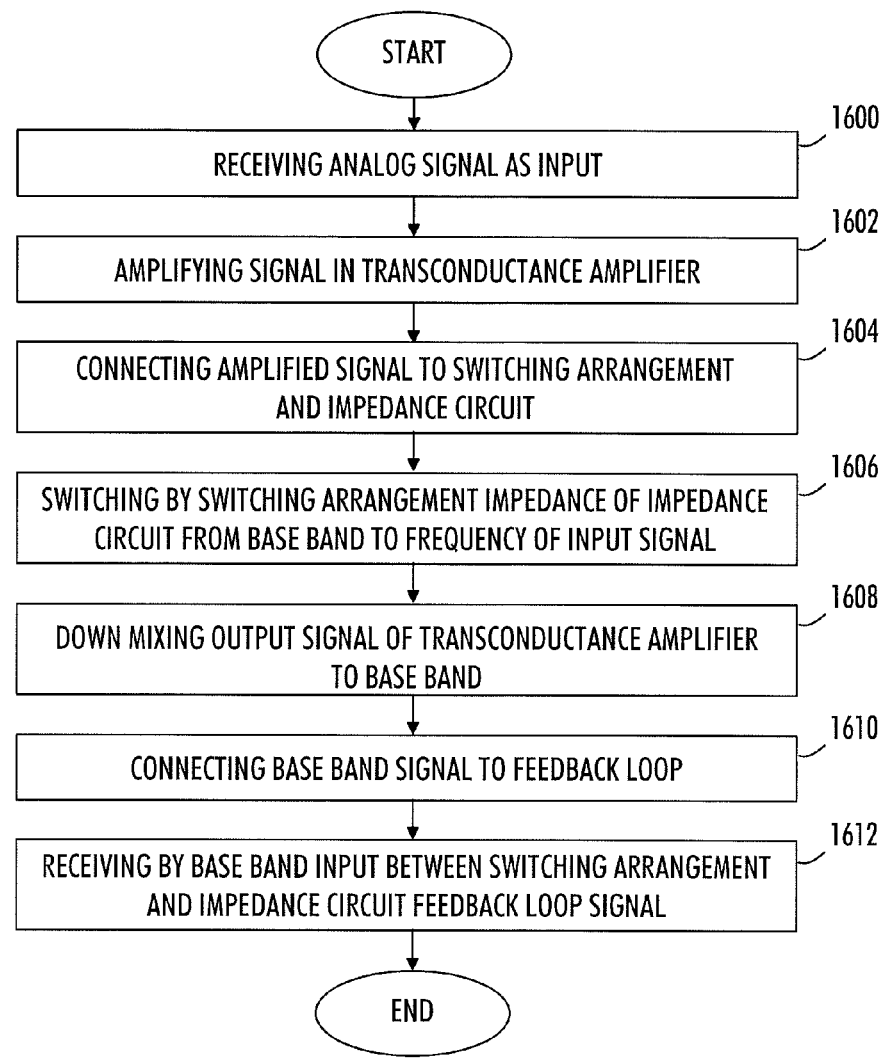

FIG. 16A is a flowchart illustrating an embodiment of the invention. In step 1600, an analog signal is received as an input.

In step 1602, the signal is amplified in a transconductance amplifier.

In step 1604, the amplified signal is connected to a switching arrangement and an impedance circuit connected in series.

In step 1606, the switching arrangement switches the impedance of the impedance circuit from base band to the frequency of the input signal.

In step 1608, the output signal of the transconductance amplifier is down converted to base band.

In step 1610, the base band signal is connected to a feedback loop and an analog base band feedback signal is obtained.

In step 1612, a base band input between the switching arrangement and the impedance circuit receives the analog base band feedback signal.

Figure 16B:
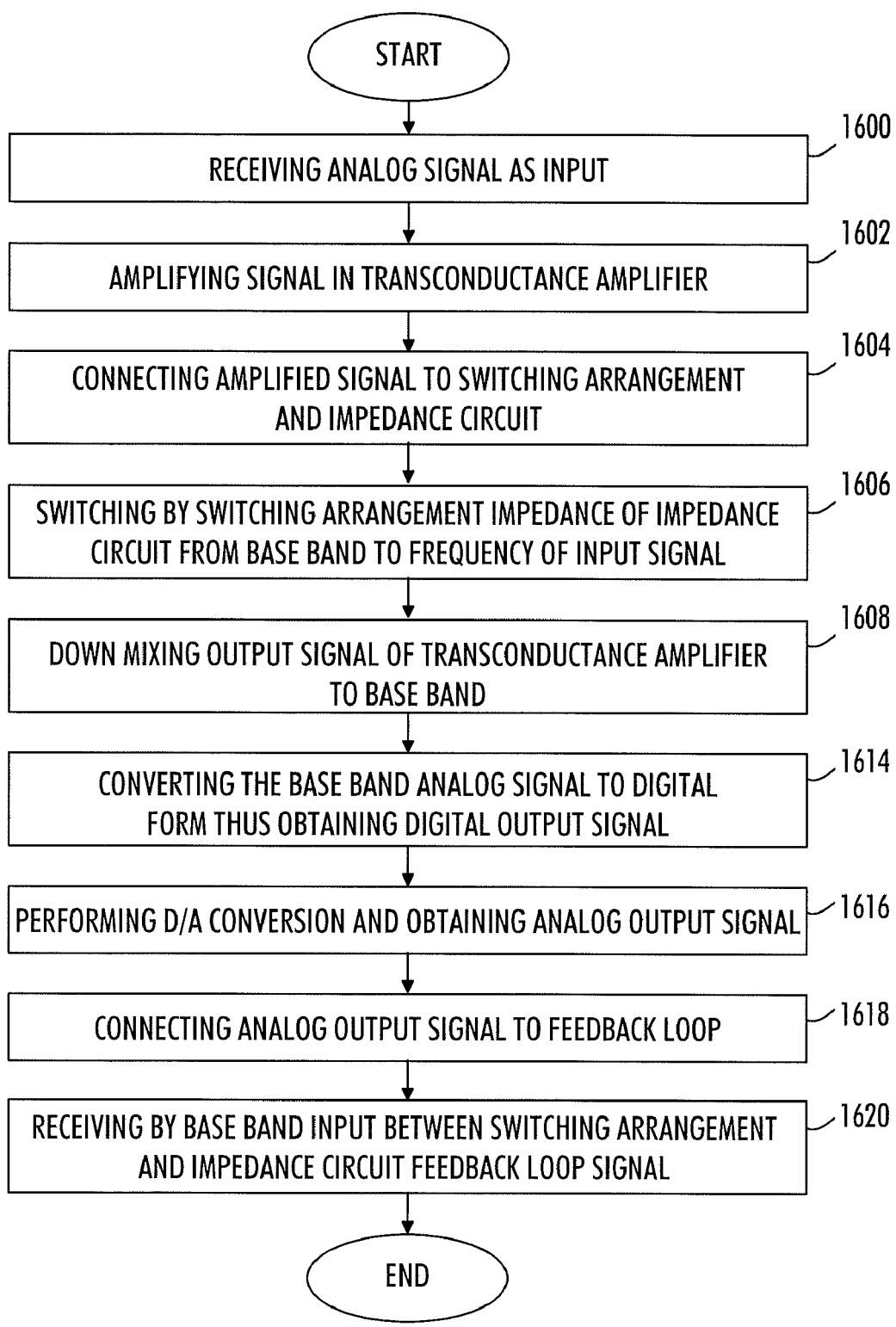

FIG. 16B is another flowchart illustrating an embodiment of the invention. The steps 1600 to 1608 are the same as in the previous chart and are not repeated here.

In step 1614, following step 1608, an A/D conversion is performed to the base band signal and one or more digital signals are obtained.

In step 1616, the one or more digital signals are converted into an analog output signal.

In step 1618, the analog output signal is connected to a feedback loop and the analog base band feedback signal is obtained.

In step 1620, a base band input between the switching arrangement and the impedance circuit receives the analog base band feedback signal.

In an embodiment, the base band feedback signal upconverted to RF with impedance transferring circuit shapes the low frequency flicker and thermal noise of base band integrator stages after downconversion. The noise-shaping behavior of a continuous-time delta sigma modulator is illustrated using the $3^{rd}$ order delta sigma modulator of FIG. 17 as an example.

Figure 17:
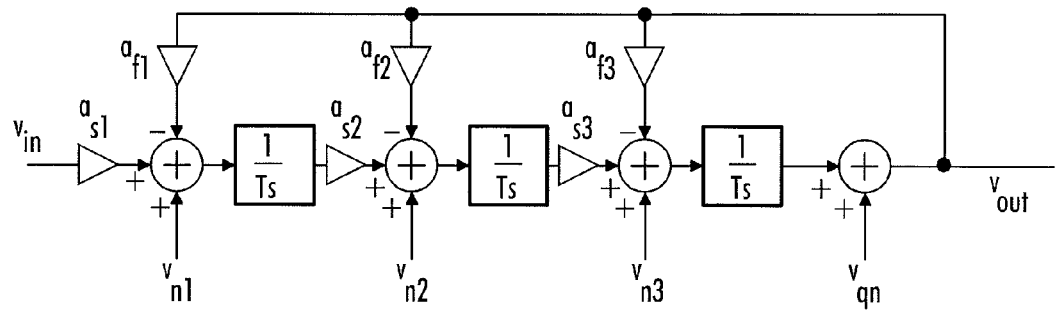
FIG. 17 illustrates the noise-shaping behavior of a continuous-time delta sigma modulator.

The delta sigma modulator of FIG. 17 comprises three integrators 700, 702 and 704 (with a transfer function $1/(T*s)$) with feedback 706 to each integrator stage. The feedback amplification is denoted with amplifiers $a_{f1}$, $a_{f2}$ and $a_{f3}$. The forward path amplification is denoted with amplifiers $a_{s1}$, $a_{s2}$ and $a_{s3}$. The quantization noise in a delta-sigma modulator can be assumed as an arbitrary error voltage which is added to the signal when the signal is converted from analogue into digital domain. This is depicted in the signal flow graph of a 3rd order modulator of FIG. 17 where, in addition to a quantization noise source $v_{qn}$, also the analog noise contribution of each integrator is modeled with input reduced noise sources $v_{n1}$, $v_{n2}$ and $v_{n3}$.

The equation for the output voltage $v_{out}$ as a function of input voltage $v_{in}$ and quantization and analogue noise sources may be expressed as $$v_{out} = \frac{s^3 T^3 v_{qn} + s^2 T^2 v_{n3} + s a_{s3} T v_{n2} + a_{s2} a_{s3} v_{n1} + a_{s1} a_{s2} a_{s3} v_{in}}{s^3 T^3 + s^2 a_{f3} T^2 + s a_{f2} a_{s3} T + a_{f1} a_{s2} a_{s3}}. \quad (1)$$

Equation 1 shows that the modulator performs 3rd order low pass filtering for the input signal $v_{in}$ and 3rd order high pass filtering for the quantization noise $v_{qn}$. The analogue noise of the first integrator is 3rd order low pass filtered the same way as the input signal. However, the noise at the second integrator input is 1st order high pass filtered and the noise at the third integrator input is 2nd order high pass filtered.

At very low frequencies, the output voltage of the $\Delta\Sigma$-modulator can be approximated as $$v_{out} \approx \frac{a_{s1}}{a_{f1}} \left( v_{in} + \frac{1}{a_{s1}} v_{n1} + \frac{sT}{a_{s1} a_{s2}} v_{n2} \right).$$

In an embodiment, the pass band gain of the modulator is scaled by scaling coefficients $a_{s1}$, $a_{s2}$ and $a_{f1}$:

$a_{s1} = k_1$ $a_{s2} = k_2$ $a_{f1} = 1/k_2$.

Thus, the resulting output voltage equation may be expressed as $$v_{out} = k_1 k_2 \left( v_{in} + \frac{1}{k_1} v_{n1} + \frac{sT}{k_1 k_2} v_{n2} \right).$$

In base band frequency range, 1/f-noise is dominating especially in narrow bandwidth radio systems such as GSM. This means that the high pass filtering of the second and later integration stages efficiently reduces the noise contribution of the later integrator stages. In fact, the noise of the later integrator stages become visible only in very wide bandwidths since the noise shaping for integrator noise is always at least one order weaker than the noise shaping of quantization noise. In addition, the noise at the last integrator output is aliased in the quantizer. This is not included in these noise calculations.

In the case of the frequency translating delta sigma modulator with impedance transferring circuits, the first integrator stage is transferred into a resonator at RF-frequencies and therefore the first noise source includes only white noise. The first place where 1/f-noise has a contribution to the total modulator noise in the base band outputs of the second impedance transferring circuit. Thus, the input reduced noise of Miller-integrators after down conversion is exactly the same as $v_{n2}$ in FIG. 17. Because of the noise shaping, the 1/f-noise of the Miller-integrators is derivated into white noise. In addition, noise in the down mixer is also slightly shaped. The 1/f-noise in the feedback D/A-converters is spread by the modulator output signal so that this does not contribute to the 1/f-noise of the modulator.

The first transconductance amplifier of the frequency translating delta sigma modulator with impedance transferring circuits basically corresponds to the LNA of the receiver. Therefore, the noise source $v_{n1}$ can be assumed to correspond to the noise the LNA output. Similarly, the noise source $v_{n2}$ is comparable to the noise at the downconverting mixer output. This means that the noise figure of a receiver implemented with a frequency translating delta sigma modulator with a two impedance transferring circuits is set by the noise figure of the low noise amplifier and the following downconverting mixer while 1/f-noise at the downconverter output is cancelled even without any special 1/f-noise reduction methods such as chopping, auto zeroing or correlated double sampling. The noise contribution of the later base band integrator stages is negligible, especially if the gain embedded in the first two stages (LNA and mixer) is high enough.

If we reduce the noise sources $v_{n1}$ and $v_{n2}$ to the inputs of transconductance amplifiers of the impedance transferring circuits by letting $v_{n1} = k_1 v_{ni1}$ $v_{n2} = k_2 v_{ni2}$ the output voltage as a function of input signal and the two most significant input referred noise sources can be expressed as $$v_{out} = k_1 k_2 \left( v_{in} + v_{ni1} + \frac{sT}{k_1} v_{ni2} \right).$$

Even though the invention has been described above with reference to the examples according to the accompanying drawings, it is clear that the invention is not restricted thereto but it can be modified in several ways within the scope of the appended claims.

The invention claimed is:
1. An apparatus, comprising
a frequency selective circuit with at least one resonator stages, a frequency down converting stage and having an analog signal as an input, wherein the at least one resonator stage is realized with an impedance transferring circuit comprising:
a transconductance amplifier, and
a switching arrangement and an impedance circuit connected in series, the switching arrangement being configured to switch the impedance of the impedance circuit from base band to the frequency of the input signal and
a base band input between the switching arrangement and the impedance circuit, configured to receive an analog feedback signal from the output of the frequency selective circuit.

2. The apparatus of claim 1, wherein the frequency down converting stage is realized with another impedance transferring circuit comprising:
- another transconductance amplifier; and
- another switching arrangement and another impedance circuit connected in series, the other switching arrangement being configured to frequency down convert the input signal; and
- a base band output between the other switching arrangement and the other impedance circuit.

3. The apparatus of claim 2, wherein the frequency selective circuit comprises:
- an A/D converter, configured to receive the base band output signal and to produce one or more digital 1-bit or multibit signals as the output signal of the frequency selective circuit, and
- a D/A converter configured to convert the output signal of the frequency selective circuit to the analog feedback signal.

4. The apparatus of claim 3, comprising an active Miller integrator connected between the base band output and the A/D converter input.

5. The apparatus of claim 3, wherein the D/A converter is configured to provide a FIR filter function and comprises:
- at least one delay line, and
- at least two 1-bit D/A converters.

6. The apparatus of claim 1, wherein the frequency down converting stage comprises a quadrature down converting mixer.

7. The apparatus of claim 1, wherein the impedance transferring circuit of the at least one resonator stage is configured to integrate and frequency up convert the analog feedback signal, and add the resulting signal to the input signal before the frequency down converting of the input signal.

8. The apparatus of claim 1, wherein the frequency selective circuit comprises a delta sigma modulator.

9. A method, comprising:
- receiving an analog signal as an input;
- processing the analog signal in at least one circuit by amplifying the signal in a transconductance amplifier,
- connecting the amplified signal to a switching arrangement and an impedance circuit connected in series,
- switching by the switching arrangement the impedance of the impedance circuit from base band to the frequency of the input signal;
- connecting the amplified signal to a second circuit;
- down mixing the signal to base band by the second circuit and obtaining a base band output signal;
- connecting the base band output signal to a feedback loop and obtaining an analog base band feedback signal; and
- receiving by a base band input between the switching arrangement and the impedance circuit the analog base band feedback signal from the feedback loop.

10. The method of claim 9, further comprising:
upconverting the feedback signal to a frequency in the frequency range of the input signal.

11. The method of claim 9, further comprising:
filtering the base band output signal with an active Miller integrator.

12. The method of claim 9, further comprising:
performing an A/D conversion to the base band output signal of the second circuit and obtaining one or more digital signals.

13. The method of claim 12, further comprising:
converting the one or more digital signals into an analog output signal; and
connecting the analog output signal to the feedback loop and obtaining the analog base band feedback signal.

14. The method of claim 12, further comprising:
performing comb filtering to the one or more digital signals; and
converting the one or more comb filtered signals into an analog output signal; and
connecting the analog output signal to the feedback loop and obtaining the analog base band feedback signal.

15. The method of claim 9, further comprising:
performing delta sigma modulation to the base band output signal of the second circuit and obtaining one or more digital signals.

* * * * *